US006987300B2

(12) United States Patent
Yach et al.

(10) Patent No.: US 6,987,300 B2
(45) Date of Patent: Jan. 17, 2006

(54) HIGH VOLTAGE ESD-PROTECTION STRUCTURE

(75) Inventors: Randy L. Yach, Phoenix, AZ (US); Greg Dix, Tempe, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 10/809,659

(22) Filed: Mar. 25, 2004

(65) Prior Publication Data

US 2005/0212052 A1    Sep. 29, 2005

(51) Int. Cl.
*H01L 23/62* (2006.01)
(52) U.S. Cl. .................. 257/361; 257/355; 257/360
(58) Field of Classification Search ................ 257/355, 257/356, 357, 358, 359, 360, 361, 362, 363; 438/309
See application file for complete search history.

(56) References Cited

U.S. PATENT DOCUMENTS

| | | | | | |
|---|---|---|---|---|---|
| 5,691,557 | A | * | 11/1997 | Watanabe | 257/357 |
| 5,763,918 | A | * | 6/1998 | El-Kareh et al. | 257/355 |
| 5,895,940 | A | * | 4/1999 | Kim | 257/173 |
| 6,373,105 | B1 | * | 4/2002 | Lin | 257/357 |
| 6,441,439 | B1 | * | 8/2002 | Huang et al. | 257/355 |
| 6,479,869 | B1 | * | 11/2002 | Hiraga | 257/350 |
| 6,535,368 | B2 | * | 3/2003 | Andresen et al. | 361/56 |
| 6,594,132 | B1 | * | 7/2003 | Avery | 361/111 |
| 6,826,026 | B2 | * | 11/2004 | Duvvury et al. | 361/56 |
| 6,891,207 | B2 | * | 5/2005 | Pequignot et al. | 257/173 |
| 6,891,230 | B2 | * | 5/2005 | Yu | 257/361 |
| 6,919,603 | B2 | * | 7/2005 | Brodsky et al. | 257/361 |

* cited by examiner

*Primary Examiner*—Long Pham
*Assistant Examiner*—Thao X. Le
(74) *Attorney, Agent, or Firm*—Baker Botts L.L.P.

(57) ABSTRACT

A high voltage ESD-protection structure is used to protect delicate transistor circuits connected to an input or output of an integrated circuit bond pad from destructive high voltage ESD events by conducting at a controlled breakdown voltage that is less than a voltage that may cause destructive breakdown of the input and/or output circuits. The ESD-protection structure is able to absorb high current from these ESD events without snapback that would compromise operation of the higher voltage inputs and/or outputs of the integrated circuit. The ESD-protection structure will conduct when an ESD event occurs at a voltage above a controlled breakdown voltage of an electronic device, e.g., diode, in the ESD protection structure. Conduction of current from an ESD event having a voltage above the electronic device controlled breakdown voltage may be through another electronic device, e.g., transistor, having high current conduction capabilities, in the ESD-protection structure that may be controlled (triggered) by the device (e.g., diode) determining the controlled breakdown voltage (at which the ESD voltage is clamped to a desired value). The high voltage ESD-protection structure may be located substantially under the bond pad and may also include a low capacitance forward diode structure between the bond pad and the ESD clamp circuit.

22 Claims, 3 Drawing Sheets

HIGH VOLTAGE ESD-PROTECTION STRUCTURE

FIELD OF THE INVENTION

The present invention relates generally to semiconductor integrated circuits, and more particularly to protection of the semiconductor integrated circuits from electrostatic discharge (ESD).

BACKGROUND OF THE INVENTION TECHNOLOGY

Modern electronic equipment uses digital semiconductor integrated circuits for operation thereof. The digital semiconductor integrated circuits receive inputs from various sources, e.g., pushbuttons, sensors, etc., and have outputs that control operation of the equipment based upon the various inputs thereto. The inputs and outputs of the semiconductor integrated circuits may be subject to undesirable high voltage electrostatic discharge (ESD) in addition to the desired input or output signal level. The ESD, characterized by fast transient high voltage discharges, may be from static electricity generated by a user of the equipment, equipment handling, power supply voltage transients and the like. An ESD event may create a sufficiently high voltage to cause destructive breakdown of transistor devices connected to the inputs and/or outputs of the semiconductor integrated circuits.

Semiconductor integrated circuits are becoming functionally more capable and are operating at faster speeds. The increased functional capability is the result of higher transistor count in each integrated circuit, thereby allowing the operation of more sophisticated software and/or firmware to produce the many features available in the equipment. The faster operating speeds further enhance the operation of the equipment. In order to keep integrated circuit die size within a reasonable cost, the electronic circuits therein must be more densely concentrated in as small an area as possible, thus the many transistors making up the electronic circuits within the integrated circuit must be made as small as possible. As these transistors become smaller and smaller, the spacing of the parts of each transistor, e.g., source, gate, drain, becomes smaller, as does the dielectric thickness of the insulation between these parts. The extremely thin dielectric is very susceptible to damage by excessive voltages present in an ESD event that may cause destructive breakdown of an input and/or output device. Also, as operational speeds increase, the need for low capacitance structures becomes more important.

Various voltage protection circuits have been used to limit the peak voltage at an input and/or output of an integrated circuit. Attempts have been made to incorporate ESD protection within the integrated circuit, but are either not very effective, and/or require a significant amount of area within the integrated circuit die. When an ESD event occurs, some ESD protection circuits will remain conductive to ground at a lower voltage than what initially triggered conduction in the ESD protection circuit. This is called "snapback" and is undesirable, especially when an input and/or output is adapted for high voltage operation (voltage being higher than a normal logic voltage level). Use of the breakdown voltage of a diode for ESD protection has no snapback problems but lacked sufficient current handling for most ESD events.

Therefore, what is needed is an ESD protection circuit integral within the integrated circuit die that is effective is protecting sensitive input and/or output circuits from an ESD event that may cause destructive breakdown, has enough current handling capabilities during the ESD event and does not snapback from the ESD event occurrence.

SUMMARY OF THE INVENTION

The invention overcomes the above-identified problems as well as other shortcomings and deficiencies of existing technologies by providing a high voltage ESD-protection structure that is effective is protecting sensitive input and/or output circuits from an ESD event by having a controlled breakdown at a voltage that is less than a voltage that may cause destructive breakdown of the input and/or output circuits, has enough current handling capabilities during the ESD event and does not snapback from the ESD event occurrence.

According to an embodiment of the invention, a high voltage ESD-protection structure may advantageously be located substantially under an integrated circuit bond pad. The high voltage ESD-protection structure protects the delicate transistor circuits connected to the bond pad from destructive high voltage ESD events by having a controlled breakdown at a voltage that is less than a voltage that may cause destructive breakdown of the input and/or output circuits. The high voltage ESD-protection structure is able to absorb high current from these ESD events without snapback that would compromise operation of the higher voltage inputs and/or outputs of the integrated circuit. The ESD-protection structure will conduct whenever an ESD event occurs at a voltage above a controlled breakdown voltage of an electronic device, e.g., diode, in the ESD-protection structure. Conduction of current from an ESD event having a voltage above the electronic device controlled breakdown voltage may be through another electronic device, e.g., transistor, having high current conduction capabilities, in the ESD-protection structure that may be controlled (triggered) by the device (e.g., diode) determining the controlled breakdown voltage (at which the ESD voltage is clamped to a desired value).

According to embodiments of the invention, a PNP transistor may be connected to an input and/or output pad of an integrated circuit device. The base of the PNP transistor may be connected to a diode having a controlled breakdown voltage having a desired trigger controlled breakdown voltage. When a voltage from an ESD event occurs that is greater than the controlled breakdown voltage of the electronic device, e.g., diode, the controlled breakdown voltage will cause the PNP transistor to conduct, e.g., from the input and/or output pad to ground. Since the PNP transistor structure is capable of conducting high transient currents, the PNP transistor structure will effectively and safely shunt any destructive voltage ESD event to ground. When the voltage at the ESD event voltage is below the controlled breakdown voltage, the PNP transistor will turn off and will not remain in a snapback condition, thus returning the input and/or output pad to full normal voltage operation.

According to embodiments of the invention, an ESD-protection structure may, but is not limited to, be located substantially under an integrated circuit bond pad in which further a low capacitance structure is formed by creating a forward diode between the bond pad and the ESD clamp circuit. Placing an ESD-protection structure under the bond pad may eliminate parasitic substrate capacitance. Furthermore a parasitic PNP transistor may be formed from the inserted forward biased diode.

An embodiment of the invention comprises a semiconductor structure of a plurality of first P+ diffusions, each of the plurality of first P+ diffusions is surrounded by a first N+ diffusion. The plurality of first P+ diffusions and the first N+ diffusion are located substantially under a bond pad to be ESD protected. The P+ diffusions may be shaped in squares, rectangles, stripes and the like (other shapes and are also contemplated herein), and may be connected to the conductive bond pad with conductive vias through an insulating layer located between the bond pad, the plurality of first P+ diffusions and the N+ diffusion. The first N+ diffusion surrounds each of the plurality of first P+ diffusions. The first N+ diffusion is insulated from the bond pad by the insulating layer. A first N-well is located in a P-well of the integrated circuit and substantially under the first N+ diffusion and the plurality of first P+ diffusions. The P-well may be a P-substrate of an integrated circuit, or the P-well may be a P-well in an N-substrate of an integrated circuit.

A second N-well is located in the P-well and adjacent to the first N-well. A second N+ diffusion and a second P+ diffusion are located in the second N-well. The second N+ diffusion is connected to the first N+ diffusion with a conductor. A third P+ diffusion encircles the first and second N+ and P+ diffusions and is located in the P-well. The third P+ diffusion and second P+ diffusion are connected together with a conductor. The second and third P+ diffusions may be connected to ground by a conductive connection, e.g., metal or low resistance semiconductor material. It is contemplated and with the scope of the invention that more than one second N+ diffusion, and more than one second and third P+ diffusion may be utilized in the ESD-protection structure Capacitance of the above described ESD-protection structure embodiment is minimal because the only capacitance seen by the bond pad is the P+ diffusions to N-well and the N+ and P+ diffusions/N+diode junction capacitance. The bond pad to the P-well capacitance is substantially reduced by the ESD-protection structure being mostly under the bond pad. Other ESD structures not necessarily having reduced capacitance may also be equally effective so long as the current carrying capacity and non-snap back attributes are maintained. One of ordinary skill in the art and having the benefit of this invention disclosure can implement many other ESD protection structures have a substantially fixed breakdown voltage value and a high current capacity shunt connected to a node to be ESD protected.

The invention ESD-protection structure clamps a voltage transient with a non-snapback trigger. The bond pad voltage to ground increases until the N+ diffusion to P-well diode breaks down (conducts). The bond pad voltage will therefore be a diode drop above this breakdown voltage. The ESD-protection clamping operation is enhanced by the vertical PNP parasitic structure formed from the P+ diffusions, the N-well and the P-well. The ESD transient current flows directly to the P-well due to the presence of the aforementioned vertical PNP parasitic structure.

A technical advantage is high current clamping of ESD transients. Another technical advantage is enhanced high voltage ESD clamping by the vertical PNP parasitic structure. Still another advantage is protection of higher voltage input and outputs of an integrate circuit. Yet another advantage is a non-snapback triggering of the ESD-protection clamping. Another technical advantage is reduce size for an ESD structure. Yet another technical advantage is isolating the bond pad from the substrate capacitance. Another technical advantage is reduced capacitance at a input or output node.

Features and advantages of the invention will be apparent from the following description of the embodiments, given for the purpose of disclosure and taken in conjunction with the accompanying drawing.

BRIEF DESCRIPTION OF THE DRAWING

A more complete understanding of the present disclosure and advantages thereof may be acquired by referring to the following description taken in conjunction with the accompanying drawing, wherein:

FIG. 1a illustrates a schematic diagram of a sectional elevational view of a high voltage ESD-protection structure, according to an exemplary embodiment of the invention;

FIG. 1b illustrates a schematic diagram of a plan view of the high voltage ESD-protection structure shown in FIG. 1a;

FIG. 1c illustrates a schematic diagram of a plan view of another exemplary embodiment of the high voltage ESD-protection structure shown in FIG. 1a.

Figure 1:
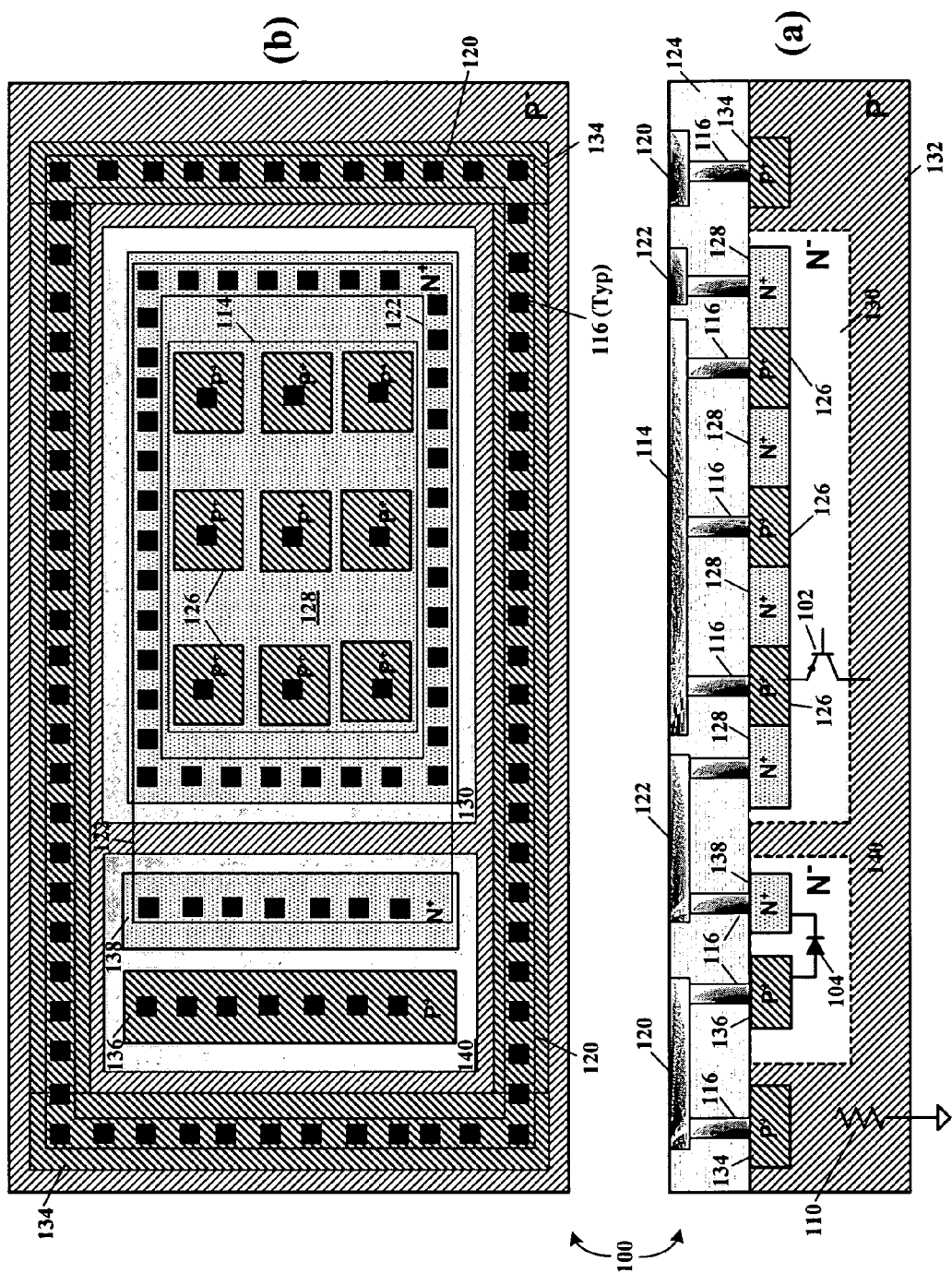

While the present invention is susceptible to various modifications and alternative forms, specific exemplary embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Referring now to the drawings, the details of exemplary embodiments of the present invention are schematically illustrated. Like elements in the drawing will be represented by like numbers, and similar elements will be represented by like numbers with a different lower case letter suffix. P- refers to lighter doped p-silicon, P+ refers to heavier doped p-silicon, N- refers to lighter doped n-silicon, and N+ refers to heavier doped n-silicon, wherein p-silicon has a plurality of positive immobile silicon ions, and n-silicon has a plurality of negative immobile silicon ions.

Figure 1C:
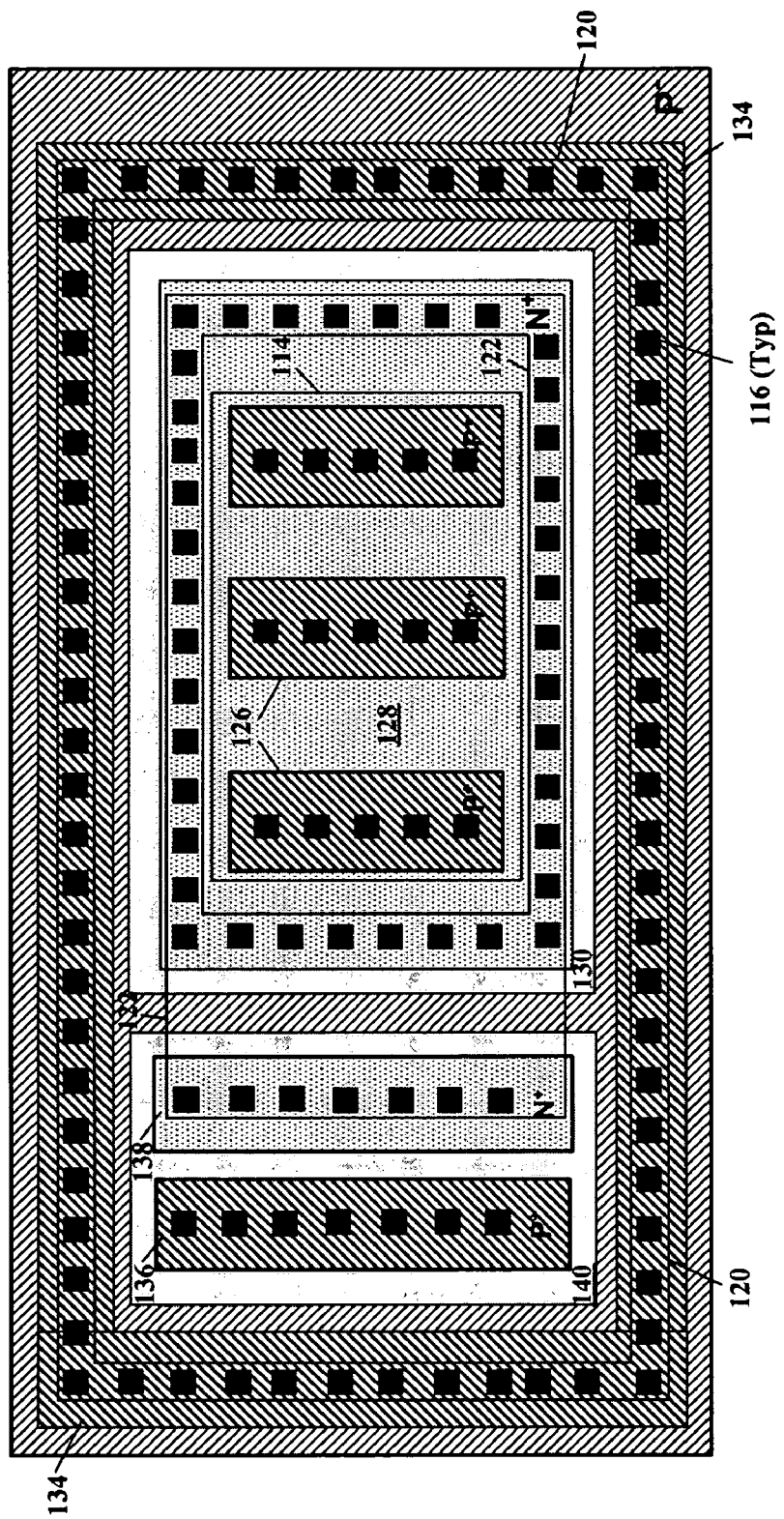

Referring to FIG. 1, depicted is a schematic diagram of a high voltage ESD-protection structure, according to an exemplary embodiment of the invention. FIG. 1a illustrates a sectional elevational view, FIG. 1b illustrates a plan view of the high voltage ESD-protection structure, and FIG. 1c illustrates a plan view of another high voltage ESD-protection structure. A semiconductor integrated circuit comprises many transistors, inputs and outputs. The high voltage ESD-protection structure shown in FIG. 1 may be advantageously used for both inputs and outputs of the integrated circuit to protect the delicate transistors connected thereto.

The high voltage ESD-protection structure of FIG. 1, generally represented by the numeral 100, comprises a plurality of first P+ diffusions 126 surrounded by a first N+ diffusion 128. The plurality of first P+ diffusions and the first N+ diffusion are located substantially under a bond pad 114 to be ESD protected. The plurality of first P+ diffusions 126, may be rectangular or square (see FIG. 1b) or may be arranged in stripes (see FIG. 1c), and are connected to the bond pad 114 with conductive vias 116 through an insulating layer 124 located between the bond pad 114, the plurality of first P+ diffusions 126 and the first N+ diffusion 128. Other shapes for the plurality of first P+ diffusions 126 may be used and are contemplated herein. The first N+ diffusion 128 is insulated from the bond pad 114 by the insulating layer 124. A first N-well 130 is located substantially under the first N+ diffusion 128 and the plurality of first P+ diffusions 126. The integrated circuit substrate 132 may comprise P-semiconductor material that behaves as a P-well. The integrated circuit well 132 comprises P-semiconductor material of which the first N-well 130 is located therein. In addition, the N+ diffusions 128 may be connected together by conductive vias connected together by conductive paths (not shown).

A second N-well 140 is located in the P-well 132 and adjacent to the first N-well 130. A second N+ diffusion 138 and a second P+ diffusion 136 are located in the second N-well 140. The second N+ diffusion 138 is connected to the first N+ diffusion 128 with conductor 122 and vias 116. A third P+ diffusion 134 encircles the first and second N+ and P+ diffusions and is located in the P-well 132. The third P+ diffusion 134 and second P+ diffusion 136 are connected together with conductor 120 and vias 116. The second P+ diffusion 136 and third P+ diffusion 134 may be connected to ground with a conductive connection, e.g., metal or low resistance semiconductor material.

A PNP transistor 102 may be formed with the first P+ diffusions 126 being the emitter, the first N-well 130 being the base and the P-well 132 being the collector. A diode 104 may be formed with the second P+ diffusion 136 (anode) and the second N+ diffusion 138 (cathode). The cathode of diode 104 may be coupled to the first N-well 130 (base of transistor 102) through conductive vias 116 and conductor 122. Generally, the P-well 132 is coupled to ground (and/or a negative rail of a power source) and functions like a resistance to ground, generally represented by resistor 110.

Capacitance of the above described high voltage ESD-protection structure 100 is minimal because the only capacitance seen by the bond pad 114 is the first P+ diffusions 126 to first N-well 130 which forms a diode junction capacitance. The bond pad metal 114 to the P-well 132 capacitance is substantially reduced because the high voltage ESD-protection structure 100 is substantially under the bond pad 114.

Figure 2:
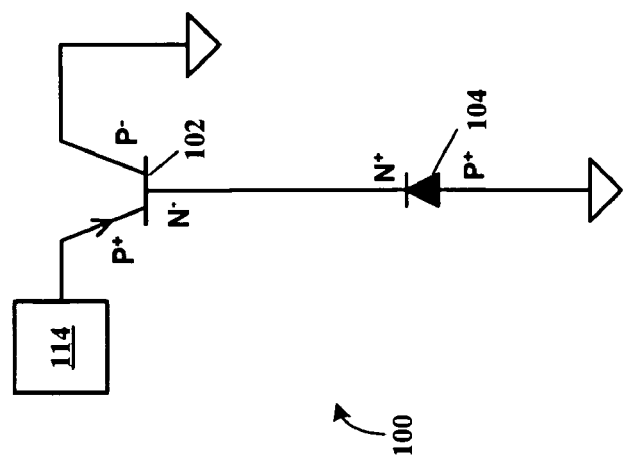
FIG. 2 illustrates a schematic circuit diagram of the high voltage ESD-protection structure of FIG. 1.

Referring to FIG. 2, depicted is a schematic circuit diagram of the high voltage ESD-protection structure of FIG. 1. The invention high voltage ESD-protection structure 100 clamps a high voltage transient on the bond pad 114 without snapback. For a positive high voltage transient, the PNP transistor 102 will conduct to ground when the controlled breakdown voltage of the diode 104 is exceeded. The positive high voltage transient will be clamped to a diode junction voltage (e.g., about 0.7 volts) above the controlled breakdown voltage of diode 104. Since the area of the PNP transistor 102 is comprised of the plurality of first P+ diffusions 126 (emitter), the first N-well 130 (base) and the P-well 132 (collector), fairly substantial currents may be handled by the invention high voltage ESD-protection structure 100.

The invention, therefore, is well adapted to carry out the objects and attain the ends and advantages mentioned, as well as others inherent therein. While the invention has been depicted, described, and is defined by reference to exemplary embodiments of the invention, such a reference does not imply a limitation on the invention, and no such limitation is to be inferred. The invention is capable of considerable modification, alternation, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. An ESD-protection structure, comprising:
    an integrated circuit having a lighter doped p-silicon well (P-well);
    a first lighter doped n-silicon well (first N-well) in the P-well;
    a plurality of first heavier doped p-silicon diffusions (first P+ diffusions) in the first N-well;
    a first heavier doped n-silicon diffusion (first N+ diffusion) in the first N-well, wherein the first N+ diffusion surrounds the plurality of first P+ diffusions;
    a second lighter doped n-silicon well (second N-well) in the P-well, the second N-well adjacent to the first N-well;
    a second heavier doped n-silicon diffusion (second N+ diffusion) in the second N-well, the second N+ diffusion is connected to the first N+ diffusion;
    a second heavier doped p-silicon diffusion (second P+ diffusion) in the second N-well;
    a third heavier doped p-silicon diffusion (third P+ diffusion) in the P-well, the third P+ diffusion is connected to the second P+ diffusion, wherein the third P+ diffusion surrounds the first N+ diffusion, the plurality of first P+ diffusions, the second N+ diffusion and the second P+ diffusion;
    a bond pad connected to the plurality of first P+ diffusions.

2. The ESD-protection structure of claim 1, wherein the P-well is the integrated circuit substrate.

3. The ESD-protection structure of claim 1, further comprising a lighter doped n-silicon substrate (N-substrate) of the integrated circuit, wherein the P-well is in the N-substrate.

4. The ESD-protection structure of claim 1, wherein the plurality of first P+ diffusions are rectangular shaped.

5. The ESD-protection structure of claim 1, wherein the plurality of P+ diffusions are square shaped.

6. The ESD-protection structure of claim 1, wherein the plurality of P+ diffusions are stripe shaped.

7. The ESD-protection structure of claim 1, wherein the bond pad is connected to the plurality of first P+ diffusions with a first plurality of conductive vias.

8. The ESD-protection structure of claim 1, wherein the connection between the first and second N+ diffusions is with a second plurality of conductive vias.

9. The ESD-protection structure of claim 1, wherein the connection between the second and third P+ diffusions is with a third plurality of conductive vias.

10. The ESD-protection structure of claim 7, wherein the first plurality of conductive vias are metal.

11. The ESD-protection structure of claim 7, wherein the first plurality of conductive vias comprise conductive semiconductor silicon.

12. The ESD-protection structure of claim 8, wherein the second plurality of conductive vias are metal.

13. The ESD-protection structure of claim 8, wherein the second plurality of conductive vias comprise conductive silicon.

14. The ESD-protection structure of claim 9, wherein the third plurality of conductive vias are metal.

15. The ESD-protection structure of claim 9, wherein the third plurality of conductive vias comprise conductive silicon.

16. The ESD-protection structure of claim 1, further comprising a second connection to the first N+ diffusion with a fourth plurality of conductive vias.

17. The ESD-protection structure of claim 1, wherein the P-well is coupled to ground.

18. The ESD-protection structure of claim 1, wherein the P-well is coupled to a common power supply rail.

19. The ESD-protection structure of claim 1, wherein the third P+ diffusion is coupled to ground.

20. The ESD-protection structure of claim 1, wherein the third P+ diffusion is coupled to a common power supply rail.

21. The ESD-protection structure of claim 1, wherein the plurality of first P+ diffusions are located substantially under the bond pad.

22. A system for protecting an integrated circuit from ESD damage, said system comprising:
- an ESD-protection structure for at least one of a plurality of input and output connections of an integrated circuit, wherein the ESD-protection structure comprises:
  - an integrated circuit having a lighter doped p-silicon well (P-well);
  - a first lighter doped n-silicon well (first N-well) in the P-well;
  - a plurality of first heavier doped p-silicon diffusions (first P+ diffusions) in the first N-well;
  - a first heavier doped n-silicon diffusion (first N+ diffusion) in the first N-well, wherein the first N+ diffusion surrounds the plurality of first P+ diffusions;
  - a second lighter doped n-silicon well (second N-well) in the P-well, the second N-well adjacent to the first N-well;
  - a second heavier doped n-silicon diffusion (second N+ diffusion) in the second N-well, the second N+ diffusion is connected to the first N+ diffusion;
  - a second heavier doped p-silicon well (second P+ diffusion) in the second N-well;
  - a third heavier doped p-silicon diffusion (third P+ diffusion) in the P-well, the third P+ diffusion is connected to the second P+ diffusion, wherein the third P+ diffusion surrounds the first N+ diffusion, the plurality of first P+ diffusions, the second N+ diffusion and the second P+ diffusion;
  - a bond pad connected to the plurality of first P+ diffusions.

* * * * *